United States Patent
Yoon et al.

(10) Patent No.: US 7,898,175 B2
(45) Date of Patent: Mar. 1, 2011

(54) ORGANIC LIGHT EMITTING DISPLAY APPARATUS WITH AN ENHANCED VIEWING ANGLE

(75) Inventors: Ji-Hwan Yoon, Suwon-si (KR); Sung-Jun Bae, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 614 days.

(21) Appl. No.: 11/780,936

(22) Filed: Jul. 20, 2007

(65) Prior Publication Data

US 2008/0185958 A1 Aug. 7, 2008

(30) Foreign Application Priority Data

Feb. 6, 2007 (KR) .................. 10-2007-0012366

(51) Int. Cl.
*H01L 51/50* (2006.01)
*H01L 51/52* (2006.01)

(52) U.S. Cl. ............. 313/512; 313/500; 313/504; 313/506; 428/690; 428/917

(58) Field of Classification Search ......... 313/498–512; 428/690, 917
See application file for complete search history.

(56) References Cited

U.S. PATENT DOCUMENTS 5,825,436 A * 10/1998 Knight .................. 349/16
5,936,596 A * 8/1999 Yoshida et al. ............. 345/9
6,211,930 B1 * 4/2001 Sautter et al. ............. 349/66

(Continued)

FOREIGN PATENT DOCUMENTS

JP 3054335 U 9/1998

(Continued)

OTHER PUBLICATIONS

Japanese Office Action in corresponding Patent Application No. 2007-150651 dated Nov. 4, 2009.

(Continued)

*Primary Examiner*—Sikha Roy
*Assistant Examiner*—Jose M Diaz
(74) *Attorney, Agent, or Firm*—Knobbe Martens Olson & Bear LLP

(57) ABSTRACT

An organic light emitting display apparatus includes a first substrate, a plurality of organic light emitting pixels formed on the substrate, a second substrate bonded to the substrate to seal the organic light emitting pixels. A black matrix layer is formed on a surface of the second substrate facing the first substrate and provides a plurality of openings. One of the openings and one of the pixels are aligned. The pixel has a first edge and a second edge and the opening has a first edge and a second edge. The first edge of the pixel is closer to the first edge of the opening than the second edge of the opening. The two edges of the opening are interposed between the two edges of the pixels when viewed from a direction perpendicular to the surface. Where L is an imaginary straight line passing the first edge of the pixel and the second edge of the opening in an imaginary plane perpendicular to a direction in which the edges extend, the imaginary line L and the first surface form an acute angle which is greater than about 30° and smaller than about 45°.

17 Claims, 4 Drawing Sheets

U.S. PATENT DOCUMENTS

| | | | |
|---|---|---|---|
| 7,551,239 B2 * | 6/2009 | Fukushima et al. | 349/16 |
| 2002/0001128 A1 * | 1/2002 | Moseley et al. | 359/465 |
| 2004/0232833 A1 | 11/2004 | Menda et al. | |
| 2005/0174529 A1 * | 8/2005 | Fukushima et al. | 349/197 |
| 2007/0164662 A1 * | 7/2007 | Eida et al. | 313/504 |
| 2008/0106595 A1 * | 5/2008 | Yamane et al. | 348/59 |
| 2009/0015732 A1 * | 1/2009 | Yabuta et al. | 349/1 |
| 2009/0040426 A1 * | 2/2009 | Mather et al. | 349/65 |

FOREIGN PATENT DOCUMENTS

| | | |
|---|---|---|
| JP | 2001-350153 | 12/2001 |
| JP | 2002-299039 A | 10/2002 |
| JP | 2005-221756 | 8/2005 |
| JP | 2005-293946 A | 10/2005 |
| JP | 2006-309956 A | 11/2006 |
| KR | 1020000064839 A | 11/2000 |
| KR | 1020020042575 A | 6/2002 |
| KR | 10-2004-0100915 A | 12/2004 |
| WO | WO 98-34437 | 6/1998 |
| WO | WO 2005098802 A1 * | 10/2005 |

OTHER PUBLICATIONS

Korean Registration Determination Certificate of Patent for Invention Cert. No. 9-5-2007-068909678; issued Dec. 20, 2007.

* cited by examiner

ORGANIC LIGHT EMITTING DISPLAY APPARATUS WITH AN ENHANCED VIEWING ANGLE

CROSS-REFERENCE TO RELATED PATENT APPLICATION

This application claims the benefit of Korean Patent Application No. 10-2007-0012366, filed on Feb. 6, 2007, in the Korean Intellectual Property Office, the disclosure of which is incorporated herein by reference in its entirety.

BACKGROUND

1. Field

The present disclosure relates to an organic light emitting display apparatus, and more particularly, to an organic light emitting display apparatus with a limited viewing angle.

2. Discussion of the Related Technology

Recently, thin, flat, and portable display apparatuses such as field emission display apparatuses have been introduced. Due to their wide viewing angle, high contrast, and short response time, the field emission display apparatuses (emissive display apparatuses) have been considered to be the next generation of display apparatuses. Among the field emission display apparatuses, an organic light emitting display apparatus including a light emitting layer formed of an organic material has the advantages of high brightness, low driving voltage, short response time, and multi-color display over an inorganic light emitting display apparatus.

Also, the organic light emitting display apparatus is thin and lightweight, and thus, can obtain information anyplace or any time. However, when it is used in a public place, an image displayed on the organic light emitting display apparatus can be viewed not only by the user of the organic light emitting display apparatus but also by other people. Accordingly, there is a need for a portable display apparatus that can be used safely in a public place.

The discussion in this section is to provide general background information, and does not constitute an admission of prior art.

SUMMARY

An aspect of the invention provides an organic light emitting display apparatus comprising: a substrate; a display device formed on the substrate, the display device comprising a plurality of organic light emitting pixels, each pixel is spaced from an immediately neighboring pixel by a non-light emitting area; a sealing member bonded to the substrate such that the organic light emitting pixels are interposed between the substrate and the sealing member; and a black matrix formed on a surface of the sealing member facing the substrate and overlapping with the non-light emitting area when viewed in a first direction perpendicular to the surface, wherein a first one of the organic light emitting pixels overlaps with the black matrix when viewed in the first direction, wherein a is a width of the first pixel, wherein b is a width of a first area of the first pixel overlapping with the black matrix, wherein the width a and the width b are measured in a second direction parallel to the surface, wherein $t_2$ is a distance between the sealing member and the first pixel, wherein the black matrix and the first pixel are arranged so as to satisfy the following relationship: $a-\sqrt{3}\times t_2 \leq b \leq a-t_2$.

In the foregoing apparatus, the first pixel may comprise a second area overlapping with the black matrix, wherein the second area may have a width which is measured in the second direction and substantially equal to the width b. The distance between the substrate and the sealing member may be about 5 to about 20 μm. The black matrix may have a thickness of about 0.05 to about 5 μm. The display device may have a thickness of about 0.05 to about 0.5 μm.

Another aspect of the invention provides an organic light emitting display device comprising: a first substrate; a second substrate opposing the first substrate and comprising a first surface facing the first substrate; an array of organic light emitting pixels interposed between the first substrate and the second substrate, wherein the array comprises a first pixel configured to emit visible light; a black matrix layer formed on the first surface, wherein the black matrix provides a plurality of openings comprising a first opening configured to pass visible light therethrough, wherein the first opening is aligned with the first pixel such that visible light from the first pixel can pass through the first opening; wherein the first opening comprises a first edge and a second edge, both of which extend generally in a first direction parallel to the first surface; wherein the first pixel comprises a first edge and a second edge, both of which extend generally in the first direction, wherein the first edge of the first pixel is closer to the first edge of the first opening than the second edge of the first opening; wherein the first edge of the first opening is located between the first and second edges of the first pixel when viewed from a direction perpendicular to the first surface; wherein L is an imaginary straight line passing the first edge of the first pixel and the second edge of the first opening in an imaginary plane perpendicular to the first direction; and wherein the imaginary line L and the first surface form an acute angle which is greater than about 30°.

In the foregoing device, the acute angle may be smaller than about 45°. The first pixel and the first opening may be arranged so as to satisfy the following relationship: $t_2 \leq c \leq \sqrt{3} \times t_2$, wherein c is the distance between the first edge of the first opening and the second edge of the first pixel measured in a second direction perpendicular to the first direction and parallel to the first surface, and wherein $t_2$ is the distance between the first surface and a top surface of the pixel in a third direction perpendicular to the first and second directions, wherein the top surface faces the first surface. The first pixel and the first opening may be arranged so as to satisfy the following relationship: c=a−b, wherein a is the distance between the first edge of the first pixel and the second edge of the first pixel measured in a second direction perpendicular to the first direction and parallel to the first surface, and wherein b is the distance between the first edge of the first opening and the first edge of the first pixel measured in a second direction perpendicular to the first direction and parallel to the first surface. The distance a may be from about 10 μm to about 100 μm. The distance b may be from about 0.5 μm to about 10 μm. The distance $t_2$ may be from about 1 μm to about 50 μm. The first edge of the pixel may be on a top surface thereof, which faces the first surface. The first pixel may be configured to emit visible light between the first edge and the second edge. The first and second edges of the first opening may contact the first surface. The second edge of the first opening may be located between the first and second edges of the first pixel when viewed from the second substrate in the direction perpendicular to the first surface. The first pixel may overlap with the black matrix when viewed from the second substrate in the direction perpendicular to the first surface.

Yet another aspect of the invention provides an organic light emitting display device comprising: a first substrate; a second substrate opposing the first substrate and comprising a first surface facing the first substrate; an array of organic light emitting pixels interposed between the first substrate and the second substrate, wherein the array comprises a first pixel configured to emit visible light; a black matrix layer formed on the first surface, wherein the black matrix provides a plurality of openings comprising a first opening configured to pass visible light therethrough, wherein the first opening is aligned with the first pixel such that visible light from the first pixel can pass through the first opening; wherein the first opening comprises a first edge and a second edge, both of which extend generally in a first direction parallel to the first surface; wherein the first pixel comprises a first edge and a second edge, both of which extend generally in the first direction, wherein the first edge of the first pixel is closer to the first edge of the first opening than the second edge of the first opening; wherein the first edge of the first opening is located between the first and second edges of the first pixel when viewed from a direction perpendicular to the first surface wherein the first pixel and the first opening are arranged so as to satisfy the following relationship: $t_2 \leq a-b \leq \sqrt{3} \times t_2$; wherein a−b is the distance between the first edge of the first opening and the second edge of the first pixel measured in a second direction perpendicular to the first direction and parallel to the first surface; and wherein $t_2$ is the distance between the first surface and a top surface of the pixel in a third direction perpendicular to the first and second directions, wherein the top surface faces the first surface.

A further aspect of the present invention provides an organic light emitting display apparatus that has a limited viewing angle so that an image displayed thereon can be viewed only by a user of the organic light emitting display apparatus.

An aspect of the present invention provides an organic light emitting display apparatus comprising: a substrate; a plurality of display units formed on the substrate, each of the display units having an organic light emitting pixel; a sealing member bonded against a surface of the substrate to seal the organic light emitting pixel; and a black matrix unit formed on a surface of the sealing member facing the substrate and corresponding to spaces between the display units separated from each other, wherein, when a is a width of the display unit, b is a width formed by overlapping the black matrix unit with the display unit, t1 is a thickness of the display unit, and t2 is a gap between the sealing member and the display unit, the inequality $a-\sqrt{3} \times t2 \leq b \leq a-t2$ is satisfied.

The width of an edge of the display unit that overlaps with the black matrix unit and the width of another edge of the display unit that overlaps with the black matrix unit may be equal to each other. The gap between the substrate and the sealing member may be about 5 to about 20 μm. The black matrix unit may have a thickness of about 0.05 to about 5 μm. The display unit may have a thickness of about 0.05 to about 0.5 μm.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS

Embodiments of the present invention will now be described more fully with reference to the accompanying drawings in which exemplary embodiments of the invention are shown.

Figure 1:
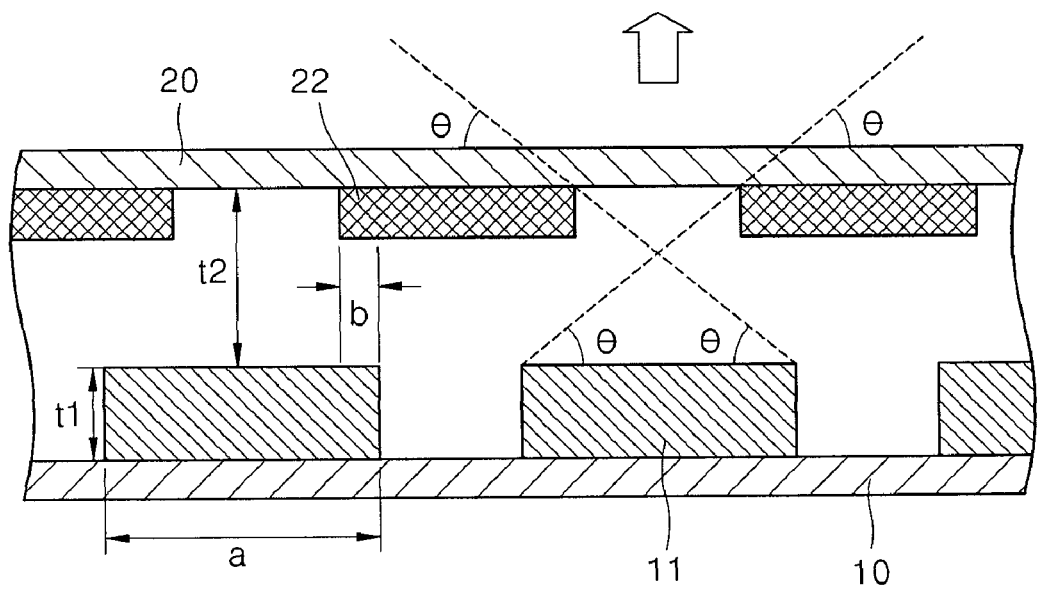
FIG. 1 is a schematic cross-sectional view illustrating an organic light emitting display apparatus according to an embodiment of the present invention.
Figure 2:
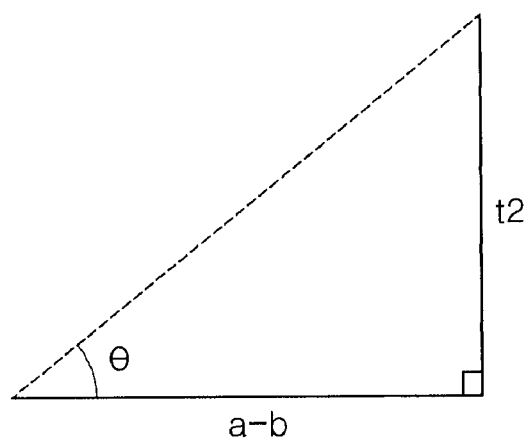
FIG. 2 shows a right-angled triangle for explaining a relationship between a display unit and the configuration of a black matrix in the organic light emitting display apparatus of FIG. 1.

FIG. 1 is a schematic cross-sectional view illustrating an organic light emitting display apparatus according to an embodiment of the present invention, and FIG. 2 shows a right-angled triangle for explaining a relationship between a display unit and the configuration of a black matrix in the organic light emitting display apparatus of FIG. 1. The organic light emitting display apparatus of FIG. 1 includes a substrate 10, a plurality of display units 11, a sealing member or second substrate 20, and a black matrix unit or layer 22.

The substrate 10 can be formed of a transparent glass material having $SiO_2$ as a main component. However, the substrate 10 can also be formed of a transparent plastic material. The plastic substrate can be formed of an insulating organic material selected from the group consisting of polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulose tiracetate (TAC), and cellulose acetate propinonate (CAP). If the organic light emitting display apparatus is a bottom emission type, that is, an image is displayed through the substrate 10, the substrate must be formed of a transparent material. However, as depicted in FIG. 1, if the organic light emitting display apparatus is a top emission type, that is, an image is displayed in a direction opposite to the substrate 10, the substrate 10 is not necessarily formed of a transparent material. In this case, the substrate 10 can be a metal substrate formed of a material selected from the group consisting of carbon, iron, chrome, nickel, titanium, molybdenum, stainless steel (SUS), invar alloy, zinconel alloy, and kovar alloy, but the present invention is not limited thereto. The metal substrate 10 can also be a metal foil.

The display units 11 are formed on a surface of the substrate 10. Each of the display units 11 includes an organic light emitting pixel that displays an image. The display units 11 can have a thickness of about 0.05 to about 0.5 μm. The organic light emitting device can be either an active matrix (AM) type device or a passive matrix (PM) type device.

The sealing member 20 is disposed to face a surface of the substrate 10. The black matrix unit 22 is formed on the sealing member 20 to correspond to spaces between the display units 11 on the substrate 10. The black matrix unit 22 can have a thickness of about 0.05 to about 5 μm. The sealing member 20 protects the organic light emitting pixels from external moisture or oxygen, and is formed of a transparent material. For this purpose, the sealing member 20 can be formed of glass or plastic, or a stacked structure of organic materials and inorganic materials.

The black matrix unit 22 is formed on one of surfaces of the sealing member 20 facing the substrate 10. The black matrix unit 22 can be formed of various dark black materials that can absorb external light, such as graphite or chrome. The black matrix unit 22 is disposed to overlap at least an outer edge of a display unit 11 and another outer edge of a display unit 11 opposing and parallel to the outer edge of the display unit 11. Referring to FIG. 1, a is the width of the display unit 11, $t_1$ is the height of the display unit 11, b is the width formed by overlapping the black matrix unit 22 and the display unit 11, and $t_2$ is the gap distance between the display unit 11 and the sealing member 20. In order to maintain the gap between the display unit 11 and the sealing member 20, the thickness of a seal (not shown) that seals a space between the substrate 10 and the sealing member 20 can be controlled or spacers can be used.

The organic light emitting display apparatus according to an embodiment of the present invention can limit a viewing angle. A viewing angle is a range of angle in which the user can see an image. In an embodiment of the present invention, the viewing angle is measured using a triangle formed between the substrate 10 and the sealing member 20. That is, referring to FIG. 1, an isosceles triangle is formed by respectively connecting ends of the display unit 11 to ends of two neighboring portions of the black matrix unit 22, and, at this point, the angle at the apex of the isosceles triangle is the viewing angle.

In the organic light emitting display apparatus according to an embodiment of the present invention, since the black matrix unit 22 is disposed to overlap outer edges of the display unit 11, the viewing angle in the left and right directions can be limited. That is, since the viewing angle is limited to as much as 90−θ in each of the left and right directions, the viewing angle in the right and left sides is limited to as much as 180−2×θ.

Referring to FIG. 2, the viewing angle can be controlled according to the mutual relationship between the width b of an area of the pixel 11 overlapping with the black matrix unit 22, the width a of the display unit 11, and the gap distance $t_2$ between the display unit 11 and the sealing member 20. That is, in the triangle of FIG. 2, the equation $\tan \theta = t_2/(a-b)$ holds, and this equation can be rearranged as $b = a - t_2/\tan \theta$. The width of the black matrix units 22 required for limiting a desired viewing angle can be determined using the above equation. In order to prevent an image from being viewed by people in the left and right sides, the limited viewing angle may be about 90° to about 120°.

Figure 3:
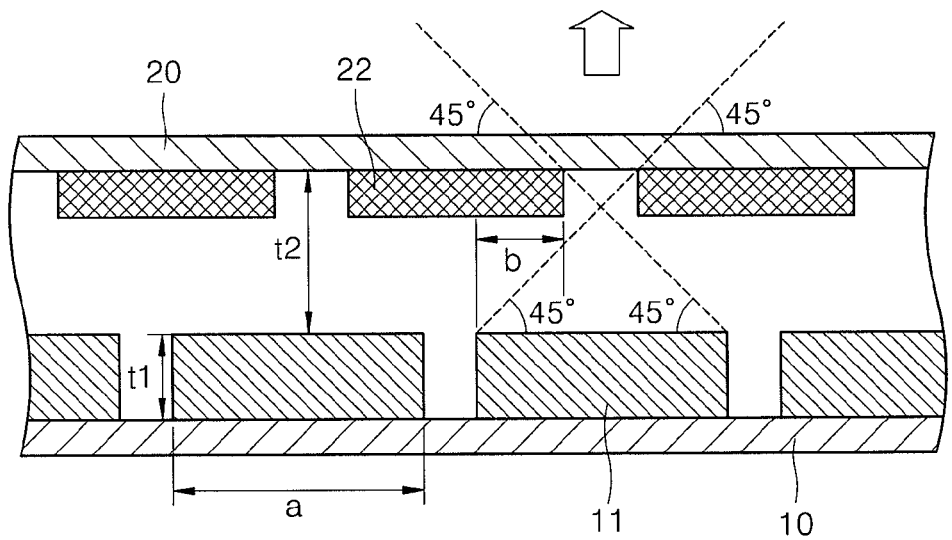
FIG. 3 is schematic cross-sectional view illustrating an organic light emitting display apparatus having a limited viewing angle of 90° from left to right, according to an embodiment of the present invention.
Figure 4:
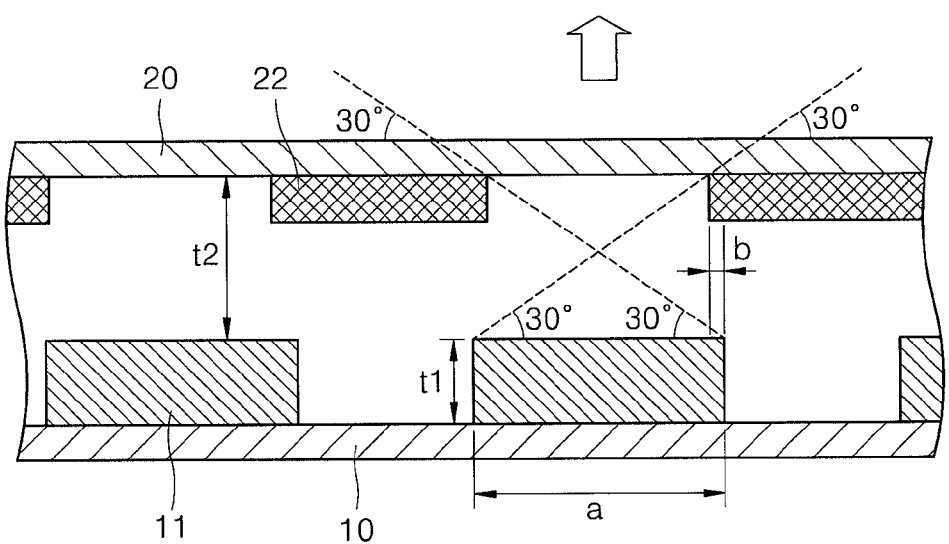
FIG. 4 is schematic cross-sectional view illustrating an organic light emitting display apparatus having a limited viewing angle of 120° from left to right, according to an embodiment of the present invention.

FIG. 3 is schematic cross-sectional view illustrating an organic light emitting display apparatus having a limited viewing angle of 90° from left to right, according to an embodiment of the present invention, and FIG. 4 is schematic cross-sectional view illustrating an organic light emitting display apparatus having a limited viewing angle of 120° from left to right, according to an embodiment of the present invention.

Referring to FIG. 3, in order to limit the viewing angle to 90°, since θ is 45°, the width b formed by overlapping the black matrix unit 22 with the display unit 11 is $a - t_2/\tan 45° = a - t_2$. Referring to FIG. 4, in order to limit the viewing angle to 120°, since θ is 60°, the width b formed by overlapping the black matrix unit 22 with the display unit 11 is $a - t_2/\tan 30° = a - t_2 \times \sqrt{3}$. In order to identically limit the left and right viewing angles, the black matrix unit 22 may overlap with the display unit 11 with the same width at the both edges of the display unit 11. If the width b formed by overlapping the black matrix unit 22 with the display unit 11 satisfies the inequality $a - \sqrt{3} \times t_2 \leq b \leq a - t_2$, the viewing angle can be limited from 90° to 120°. Therefore, the image cannot be seen by others.

Figure 5:
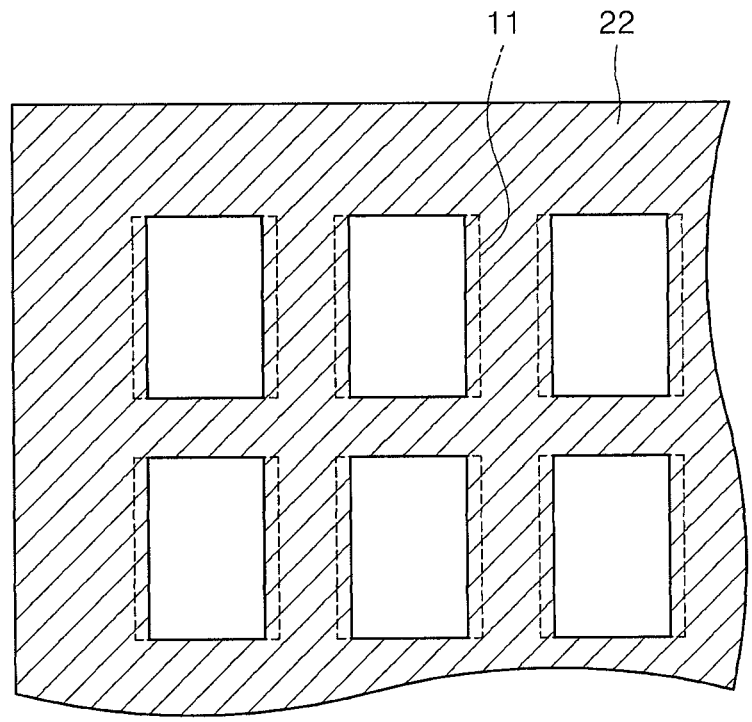
FIG. 5 is a plan view of the organic light emitting display apparatus of FIG. 1 seen from a direction indicated by the arrow, according to an embodiment of the present invention.

FIG. 5 is a schematic plan view of the organic light emitting display apparatus of FIG. 1 seen from a direction indicated by the arrow. Viewing angles in left and right sides can be limited since the black matrix unit 22 overlaps with both edges of the display unit 11.

Figure 6:
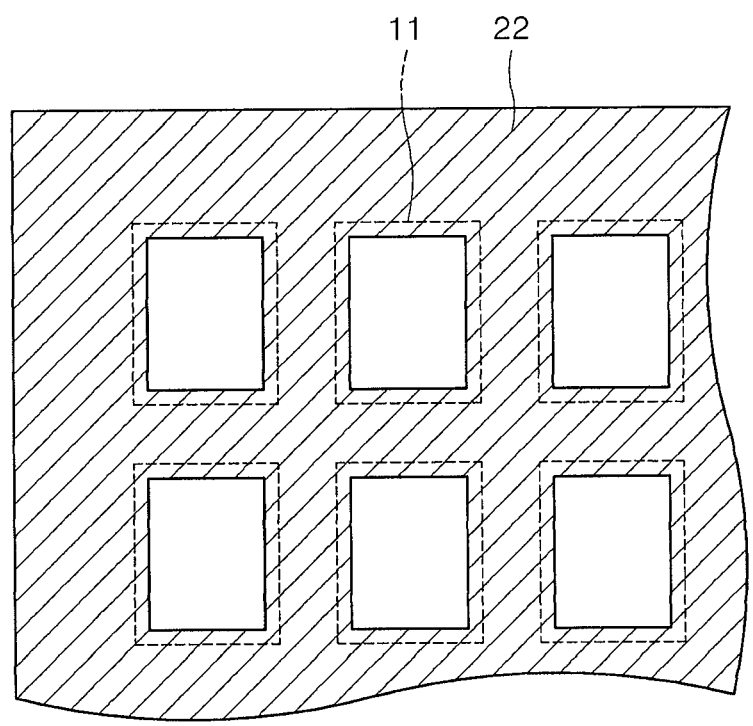
FIG. 6 is a plan view of a modified organic light emitting display apparatus according to an embodiment of the present invention.

FIG. 6 is a schematic plan view illustrating a modified organic light emitting display apparatus according to an embodiment of the present invention. Referring to FIG. 6, the black matrix unit 22 overlaps not only with the both left and right edges of the display unit 11, but also with both upper and lower edges of the display unit 11. In this case, the viewing angles in left and right sides and upper and lower sides are limited. When the viewing angles in left and right sides are limited, an image cannot be usually viewed by other people than the user of the organic light emitting display apparatus. However, when it is necessary, the viewing angles of upper and lower sides can also be limited.

Figure 7:
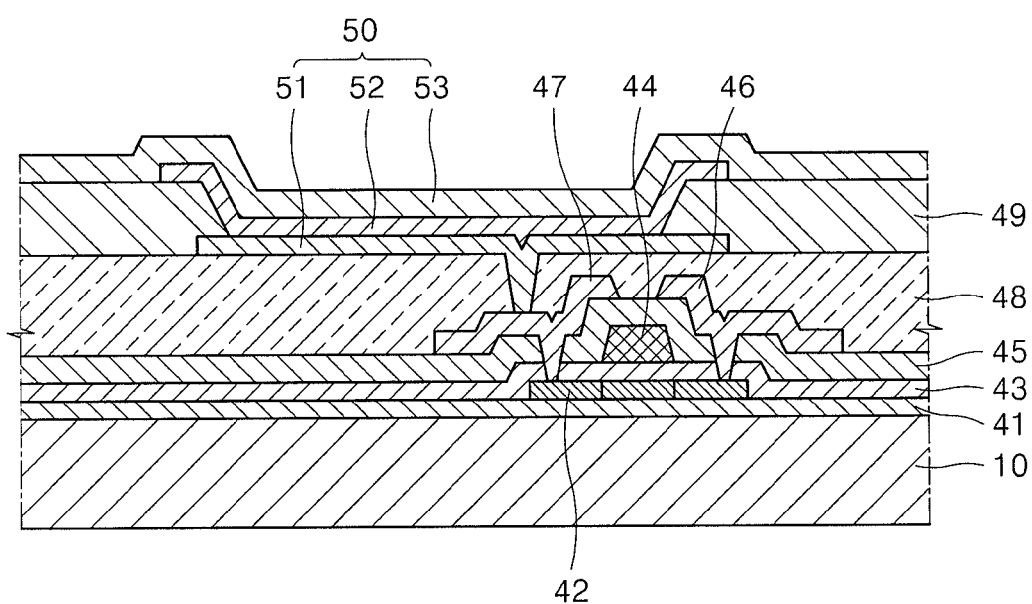
FIG. 7 is a cross-sectional view of a display unit of the organic light emitting display apparatus of FIG. 1, in which the display unit is an active matrix type organic light emitting pixel.

A method of manufacturing the organic light emitting display apparatus according to an embodiment of the present invention can be applied to various types of organic light emitting display apparatuses. FIG. 7 is a cross-sectional view of the display unit 11 of the organic light emitting display apparatus of FIG. 1. The organic light emitting display apparatus includes an AM type organic light emitting device. A buffer layer 41 can be formed on the upper surface of the substrate 10 using $SiO_2$ and/or SiNx to have the same planarity as the substrate 10 and to prevent the penetration of impure elements. A thin film transistor (TFT) is formed on the upper surface of the substrate 10. At least one TFT electrically connected to an organic light emitting pixels 50 is formed in each pixel. More specifically, a semiconductor layer 42 having a predetermined pattern is formed on the buffer layer 41. The semiconductor layer 42 can be formed of an inorganic semiconductor such as amorphous silicon or poly silicon or an organic semiconductor, and includes a source region, a drain region, and a channel region.

A gate insulating film 43 is formed on the semiconductor layer 42 using $SiO_2$ or SiNx, and a gate electrode 44 is formed in a predetermined region on the gate insulating film 43. The gate electrode 44 can be formed of MoW or Al/Cu, but is not limited thereto. That is, the gate electrode 44 can be formed of various materials in consideration of tightness with adjacent layers, planarity of stacked layers, electrical resistance, processability, etc. The gate electrode 44 is connected to a gate line (not shown) that applies on/off signals for the TFT. An interlayer insulating film 45 is formed on the gate electrode 44. A source electrode 46 and a drain electrode 47 are respectively connected to the source region and the drain region of the semiconductor layer 42 through contact holes. The TFT is protected by a passivation film 48.

The passivation film 48 can be an inorganic insulating film and/or an organic insulating film. The inorganic insulating film can be formed of $SiO_2$, SiNx, SiON, $Al_2O_3$, $TiO_2$, $Ta_2O_5$, $HfO_2$, $ZrO_2$, BST, or PZT. The organic insulating film can be formed of an ordinary polymer such as poly methylmethacrylate (PMMA) and polystyrene (PS), polymer derivatives having a phenol group, an acryl polymer, an imide polymer, an arylester polymer, an amide polymer, a fluoride polymer, a p-gilyrene polymer, a vinyl alcohol polymer, or a blended polymer of these materials. The passivation film 48 can be formed in a composite stack of inorganic insulating layers and organic insulating layers.

A first electrode 51 that acts as an anode electrode of the organic light emitting device 50 is formed on the passivation film 48, and a pixel define layer 49 covering the first electrode 51 is formed of an insulating material. After a predetermined opening is formed in the pixel define layer 49, an organic light emitting layer 52 of the organic light emitting device 50 is formed in a region defined by the opening. A second electrode 53 that acts as a cathode electrode of the organic light emitting device 50 is formed to cover all pixels. The polarity of the first electrode 51 and the second electrode 53 may be reversed.

The organic light emitting device 50 displays an image by emitting light according to a current flow, and includes the first electrode 51 electrically connected to the drain electrode 47 of the TFT through a contract hole, the organic light emitting layer 52, and the second electrode 53. The first electrode 51 can be patterned to a predetermined pattern using a photolithography method. The pattern of the first electrode 51 can be formed in stripe shaped lines separated a predetermined distance from each other if the organic light emitting display apparatus is a passive matrix (PM) type, and can be formed in a shape corresponding to the pixel if the organic light emitting display apparatus is an AM type. The second electrode 53 is disposed above the first electrode 51, and can be used as a cathode electrode by connecting to an external terminal (not shown). The second electrode 53 can be formed in a stripe shape perpendicularly crossing the pattern of the first electrode 51 if the organic light emitting display apparatus is a PM type, and can be formed on the entire active region where an image is displayed if the organic light emitting display apparatus is an AM type. The polarity of the first electrode 51 and the second electrode 53 may be reversed.

As depicted in FIG. 1, if the organic light emitting display apparatus is a top emission type, that is, an image is displayed in a direction of the second electrode 53, the first electrode 51 can be a reflective electrode and the second electrode 53 can be a transparent electrode. The reflective electrode that acts as the first electrode 51 can be formed such that, after a reflective film is formed using Ag, Mg, Al, Pt, Pd, Au, Ni, Nd, Ir, Cr, Li, Ca, or a compound of these materials, a material having a high work function such as ITO, IZO, In2O3, or ZnO is deposited on the reflective film. The transparent electrode that acts as the second electrode 53 can be formed such that, after depositing a material film using a metal having a low work function, such as Li, Ca, LiF/Ca, LiF/Al, Al, Ag, Mg, or a compound of these metals, and an auxiliary electrode layer or a bus electrode line formed of a transparent conductive material such as ITO, IZO, ZnO or In2O3 can be formed on the material film.

The organic light emitting layer 52 interposed between the first electrode 51 and the second electrode 53 emits light in response to electrical driving of the first electrode 51 and the second electrode 53. The organic light emitting layer 52 can be formed of a low molecular weight organic material or a polymer organic material. If the organic light emitting layer 52 is formed of a low molecular weight organic material, a hole transport layer (HTL) and a hole injection layer (HIL) are stacked in a direction towards the first electrode 51 from the organic light emitting layer 52, and an electron transport layer (ETL) and an electron injection layer (EIL) can be stacked in a direction towards the second electrode 53 from the organic light emitting layer 52. Besides the above layers, various layers can be stacked as necessary. The low molecular weight organic material can include copper phthalocyanine (CuPc), N,N'-di(naphthalene-1-yl)-N,N'-diphenyl-benzidine (NPB), or tris-8-hydroxyquinoline aluminum (Alq3).

If the organic light emitting layer 52 is formed of a polymer organic material, only an HTL can be included in a direction towards the first electrode 51 from the organic light emitting layer 52. The polymer HTL is formed of poly-(2,4)-ethylene-dihydroxy thiophene (PEDOT) or polyaniline (PANI) on the first electrode 51 using an inkjet printing method or a spin coating method, and the organic light emitting layer 52 is formed of poly-phenylenevinylene (PPV), soluble PPV's, cyano-PPV, or polyfluorene and can be formed to a color pattern using a method such as a screen printing method, an inkjet printing method, or a thermal transfer method using a laser.

Up to now, the AM type organic light emitting display apparatus having a top gate structure of FIG. 7 has been described. However, the present invention is not limited thereto, and can be applied to various types of organic light emitting display apparatuses.

The organic light emitting display apparatus according to an embodiment of the present invention can protect an image from being viewed by other people than the user of organic light emitting display apparatus by limiting viewing angles.

While embodiments of the present invention has been particularly shown and described, it will be understood by those of ordinary skill in the art that various changes in form and details may be made therein without departing from the spirit and scope of the present invention as defined by the following claims.

What is claimed is:

1. An organic light emitting display apparatus comprising:
a substrate;
a display device formed on the substrate, the display device comprising a plurality of organic light emitting pixels, wherein each pixel is spaced from an immediately neighboring pixel by a non-light emitting area;
a sealing member bonded to the substrate such that the organic light emitting pixels are interposed between the substrate and the sealing member; and
a black matrix formed on a surface of the sealing member facing the substrate and overlapping with the non-light emitting area when viewed in a first direction perpendicular to the surface,
wherein a first one of the organic light emitting pixels overlaps with the black matrix when viewed in the first direction, wherein a is a width of the first pixel, wherein b is a width of a first area of the first pixel overlapping with the black matrix, wherein the width a and the width b are measured in a second direction parallel to the surface, wherein $t_2$ is a distance between the sealing member and the first pixel, wherein the black matrix and the first pixel are arranged so as to satisfy the following relationship: $a - \sqrt{3} \times t_2 \leq b \leq a - t_2$; and
wherein the distance between the substrate and the sealing member is about 5 to about 20 μm.

2. The organic light emitting display apparatus of claim 1, wherein the first pixel comprises a second area overlapping with the black matrix, wherein the second area has a width which is measured in the second direction and substantially equal to the width b.

3. The organic light emitting display apparatus of claim 1, wherein the black matrix has a thickness of about 0.05 to about 5 μm.

4. The organic light emitting display apparatus of claim 1, wherein the display device has a thickness of about 0.05 to about 0.5 μm.

5. An organic light emitting display device comprising:
a first substrate;
a second substrate opposing the first substrate and comprising a first surface facing the first substrate;
an array of organic light emitting pixels interposed between the first substrate and the second substrate, wherein the array comprises a first pixel configured to emit visible light;
a black matrix layer formed on the first surface, wherein the black matrix provides a plurality of openings comprising a first opening configured to pass visible light therethrough, wherein the first opening is aligned with the first pixel such that visible light from the first pixel can pass through the first opening;
wherein the first opening comprises a first edge and a second edge, both of which extend generally in a first direction parallel to the first surface;
wherein the first pixel comprises a first edge and a second edge, both of which extend generally in the first direction, wherein the first edge of the first pixel is closer to the first edge of the first opening than the second edge of the first opening;
wherein the first edge of the first opening is located between the first and second edges of the first pixel when viewed from a direction perpendicular to the first surface;
wherein L is an imaginary straight line passing the first edge of the first pixel and the second edge of the first opening in an imaginary plane perpendicular to the first direction;
wherein the imaginary line L and the first surface form an acute angle which is greater than about 30°; and
wherein the distance between the first substrate and the second substrate is about 5 to about 20 µm.

6. The device of claim 5, wherein the acute angle is smaller than about 45°.

7. The device of claim 5, wherein the first pixel and the first opening are arranged so as to satisfy the following relationship: $t_2 \leq c \leq \sqrt{3} \times t_2$;
wherein c is the distance between the first edge of the first opening and the second edge of the first pixel measured in a second direction perpendicular to the first direction and parallel to the first surface; and
wherein $t_2$ is the distance between the first surface and a top surface of the pixel in a third direction perpendicular to the first and second directions, wherein the top surface faces the first surface.

8. The device of claim 7, wherein the first pixel and the first opening are arranged so as to satisfy the following relationship: c = a−b;
wherein a is the distance between the first edge of the first pixel and the second edge of the first pixel measured in a second direction perpendicular to the first direction and parallel to the first surface; and
wherein b is the distance between the first edge of the first opening and the first edge of the first pixel measured in a second direction perpendicular to the first direction and parallel to the first surface.

9. The device of claim 8, wherein the distance a is from about 10 µm to about 100 µm.

10. The device of claim 8, wherein the distance b is from about 0.5 µm to about 10 µm.

11. The deice of claim 8, wherein the distance $t_2$ to be from about 1 µm to less than about 20 µm.

12. The device of claim 5, wherein the first edge of the pixel is on a top surface thereof, which faces the first surface.

13. The device of claim 5, wherein the first pixel is configured to emit visible light between the first edge and the second edge.

14. The device of claim 5, wherein the first and second edges of the first opening contact the first surface.

15. The device of claim 5, wherein the second edge of the first opening is located between the first and second edges of the first pixel when viewed from the second substrate in the direction perpendicular to the first surface.

16. The device of claim 5, wherein the first pixel overlaps with the black matrix when viewed from the second substrate in the direction perpendicular to the first surface.

17. An organic light emitting display device comprising:
a first substrate;
a second substrate opposing the first substrate and comprising a first surface facing the first substrate;
an array of organic light emitting pixels interposed between the first substrate and the second substrate, wherein the array comprises a first pixel configured to emit visible light;
a black matrix layer formed on the first surface, wherein the black matrix provides a plurality of openings comprising a first opening configured to pass visible light therethrough, wherein the first opening is aligned with the first pixel such that visible light from the first pixel can pass through the first opening;
wherein the first opening comprises a first edge and a second edge, both of which extend generally in a first direction parallel to the first surface;
wherein the first pixel comprises a first edge and a second edge, both of which extend generally in the first direction, wherein the first edge of the first pixel is closer to the first edge of the first opening than the second edge of the first opening;
wherein the first edge of the first opening is located between the first and second edges of the first pixel when viewed from a direction perpendicular to the first surface
wherein the first pixel and the first opening are arranged so as to satisfy the following relationship: $t_2 \leq a-b \leq \sqrt{3} \times t_2$;
wherein a−b is the distance between the first edge of the first opening and the second edge of the first pixel measured in a second direction perpendicular to the first direction and parallel to the first surface; and
wherein $t_2$ is the distance between the first surface and a top surface of the pixel in a third direction perpendicular to the first and second directions, wherein the top surface faces the first surface; and
wherein the distance between the substrate and the sealing member is about 5 to about 20 µm.

* * * * *

UNITED STATES PATENT AND TRADEMARK OFFICE
CERTIFICATE OF CORRECTION

PATENT NO.         : 7,898,175 B2                                               Page 1 of 1
APPLICATION NO.    : 11/780936
DATED              : March 1, 2011
INVENTOR(S)        : Yoon et al.

It is certified that error appears in the above-identified patent and that said Letters Patent is hereby corrected as shown below:

| Issued Patent | | Description of Discrepancy |
|---|---|---|
| Column | Line | |
| 4 | 39 | Change "polyethyelenen" to --polyethylene--. |
| 4 | 39 | Change "napthalate" to --naphthalate--. |
| 4 | 39-40 | Change "polyethyeleneterepthalate" to --polyethyleneterephthalate--. |
| 4 | 41 | Change "tiracetate" to --triacetate--. |
| 4 | 53 (Approx.) | Change "zinconel" to --inconel--. |
| 10 | 5 | In Claim 11, change "deice" to --device--. |
| 10 | 45 | In Claim 17, change "surface" to --surface;--. |

Signed and Sealed this
Twentieth Day of March, 2012

David J. Kappos
*Director of the United States Patent and Trademark Office*